US007070423B2

(12) United States Patent
Zhang et al.

(10) Patent No.: US 7,070,423 B2
(45) Date of Patent: Jul. 4, 2006

(54) ELECTRICAL CONNECTOR WITH IMPROVED TERMINALS

(75) Inventors: Chi Zhang, Kunsan (CN); Ming Chuan Wu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/914,963

(22) Filed: Aug. 9, 2004

(65) Prior Publication Data

US 2005/0032400 A1 Feb. 10, 2005

(30) Foreign Application Priority Data

Aug. 8, 2003 (TW) .............................. 92214451 U

(51) Int. Cl.
*H01R 12/00* (2006.01)
*H05K 1/00* (2006.01)

(52) U.S. Cl. .......................................... 439/74; 439/79

(58) Field of Classification Search .................. 439/74, 439/79, 81, 83, 65, 660
See application file for complete search history.

(56) References Cited

U.S. PATENT DOCUMENTS 5,116,247 A * 5/1992 Enomoto et al. ........... 439/660
5,735,696 A * 4/1998 Niitsu et al. .................. 439/65
5,876,217 A * 3/1999 Ito et al. ........................ 439/74
6,338,630 B1 * 1/2002 Dong .......................... 439/74
6,464,515 B1 * 10/2002 Wu ............................ 439/108

* cited by examiner

*Primary Examiner*—Tulsidas C. Patel
*Assistant Examiner*—Vladimir Imas
(74) *Attorney, Agent, or Firm*—Wei Te Chung

(57) ABSTRACT

An electrical connector (100) for mounting to a printed circuit board comprises an insulative housing (10) and a plurality of terminals (30) received in the housing. The housing comprises a pair of sidewalls (14) each defining a plurality of first passageways (128) and a tongue (12) located between the sidewalls. Each of the terminals comprises a positioning portion (34), a contact portion (32), and a tail (35). The positioning portion is received in the first passageway. The contact portion is attached to a surface of the tongue. The tail extends beyond the housing. The positioning portion interferentially engages with the first passageway in a longitudinal direction to restrict the terminal from moving along the longitudinal direction of the housing.

4 Claims, 5 Drawing Sheets

ELECTRICAL CONNECTOR WITH IMPROVED TERMINALS

BACKGROUND OF THE INVENTION

1. Field of the Invention

The present invention relates to an electrical connector, and particularly to an electrical connector soldered to a printed circuit board.

2. Description of Related Art

Electrical connectors are usually used for transmitting information between two printed circuit boards. U.S. Pat. Nos. 5,116,247 and 6,338,630 disclose such connectors. Connectors disclosed by the two patents each comprise an insulative housing and a plurality of terminals received in the housing. The housing comprises a pair of sidewalls and a tongue located between the sidewalls. Each of the sidewalls defines a plurality of passageways. Each of the terminals comprises a contact portion, a retention portion, and a tail. The retention portion is received in the passageway, the contact portion is beside the tongue, and the tail extends beyond the housing.

The retention portion of the terminal of the connector disclosed by the above mentioned two US patents only restricts the terminal from moving along a lateral direction, which is perpendicular to a longitudinal direction of the housing. The terminals are arranged in the housing along the longitudinal direction and are soldered to corresponding traces in the printed circuit board along the longitudinal direction. As the retention portion does not restrict the terminal from moving along the longitudinal direction, the terminals will easily miss the very trace and solder to the wrong place, and this will influence the signal transmission between the connector and the printed circuit board.

Hence, an improved electrical connector is required to overcome the disadvantages of the prior art.

SUMMARY OF THE INVENTION

A major object of the present invention is to provide an electrical connector of which terminals are secured in position steadily.

In order to achieve the object set forth, an electrical connector in accordance with the present invention comprises an insulative housing and a plurality of terminals received in the housing. The housing comprises a pair of sidewalls each defining a plurality of first passageways and a tongue located between the sidewalls, and the insulative housing defines a longitudinal direction. Each of the terminals comprises a positioning portion, a contact portion, a retention portion, and a tail. The positioning portion is received in the first passageway. The contact portion is beside the positioning portion. The retention portion is retained in the tongue. The tail extends beyond the housing. A thickness in a longitudinal direction of the positioning portion decreases gradually from its lower portion to its upper potion. The positioning portion interferentially engages with the sidewalls and restricts the terminal from moving along the longitudinal direction.

Other objects, advantages and novel features of the invention will become more apparent from the following detailed description when taken in conjunction with the accompanying drawings.

DETAILED DESCRIPTION OF THE INVENTION

Figure 1:
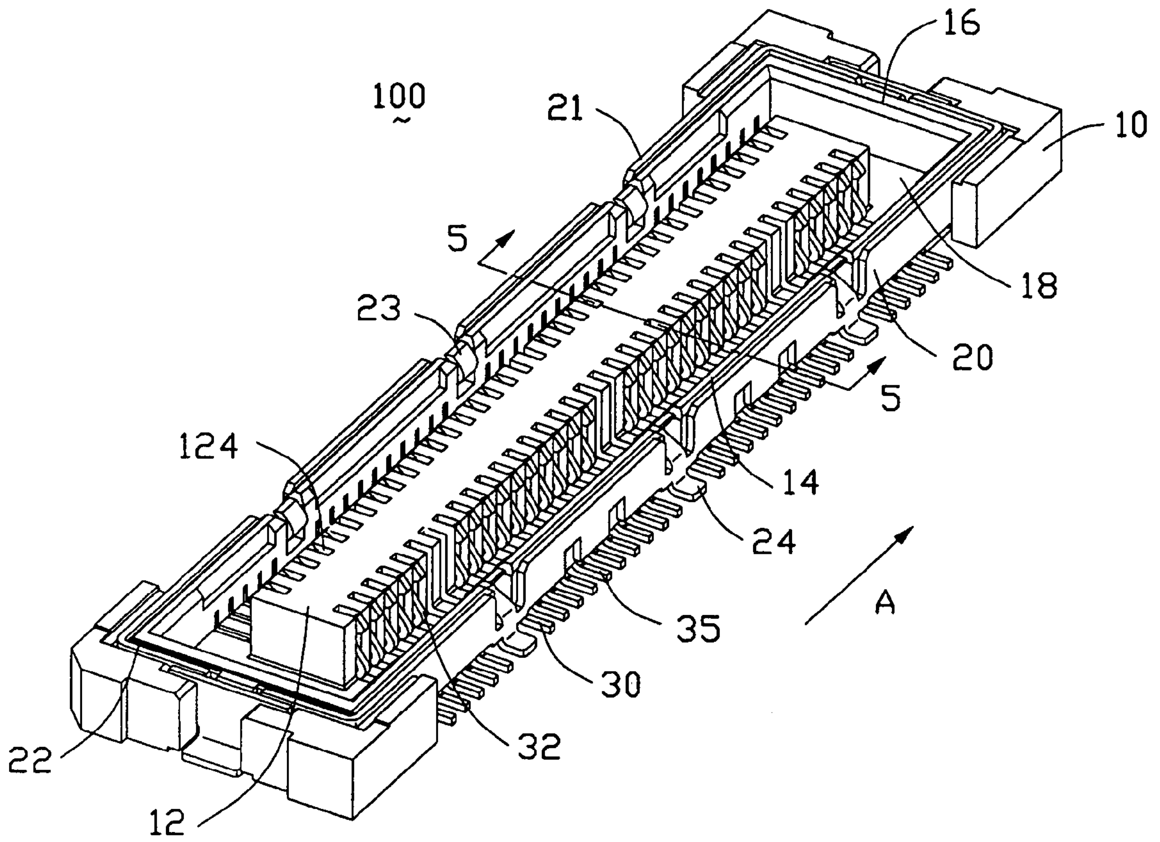
FIG. 1 is an assembled, perspective view of an electrical connector in accordance with the present invention.

Please refer to FIG. 1, an electrical connector 100 in accordance with the present invention comprises an elongated insulative housing 10, a plurality of contacts 30 received in the housing, and a pair of shields 20 assembled on the housing 10.

Figure 2:
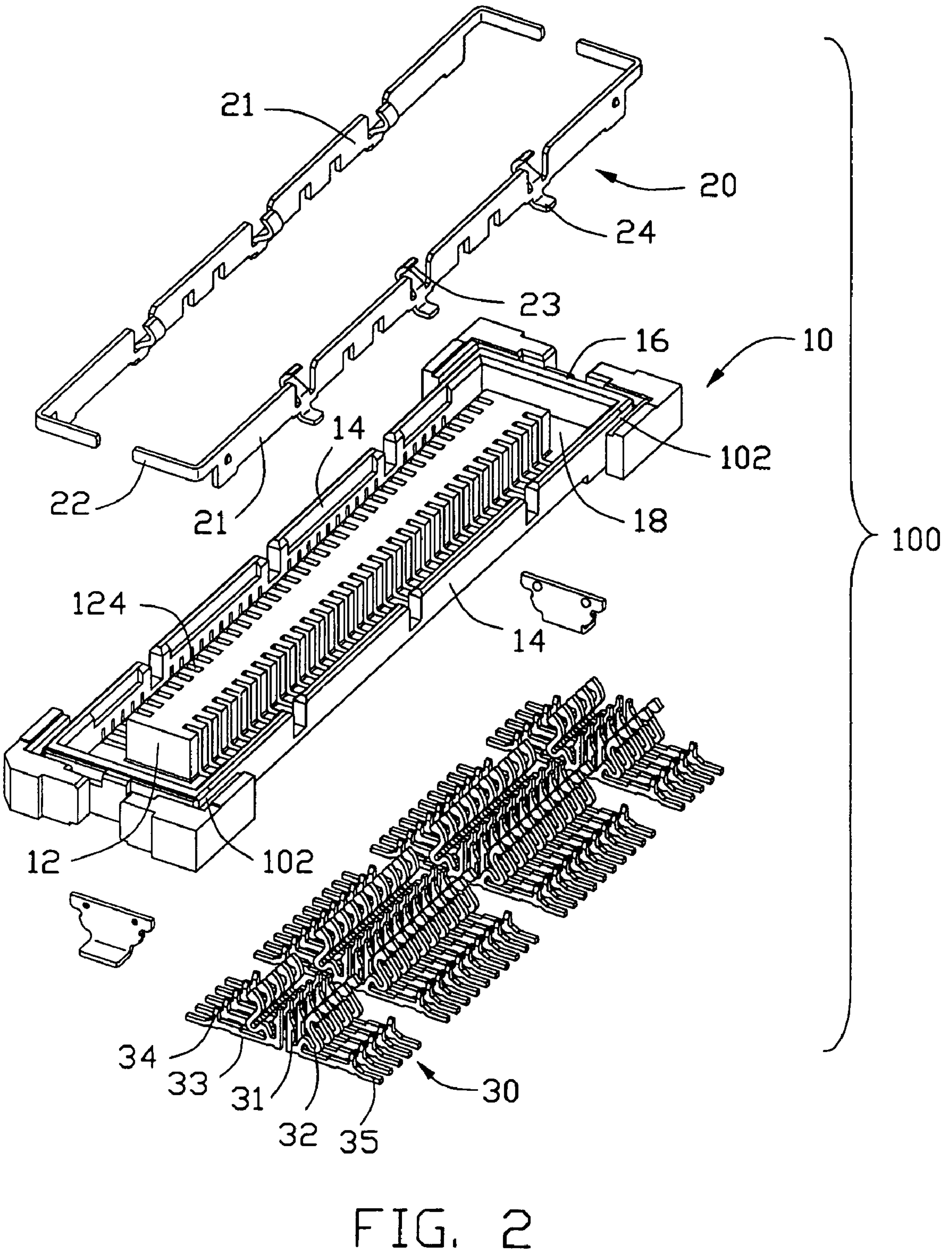
FIG. 2 is an exploded, perspective view of the electrical connector of FIG. 1.
Figure 3:
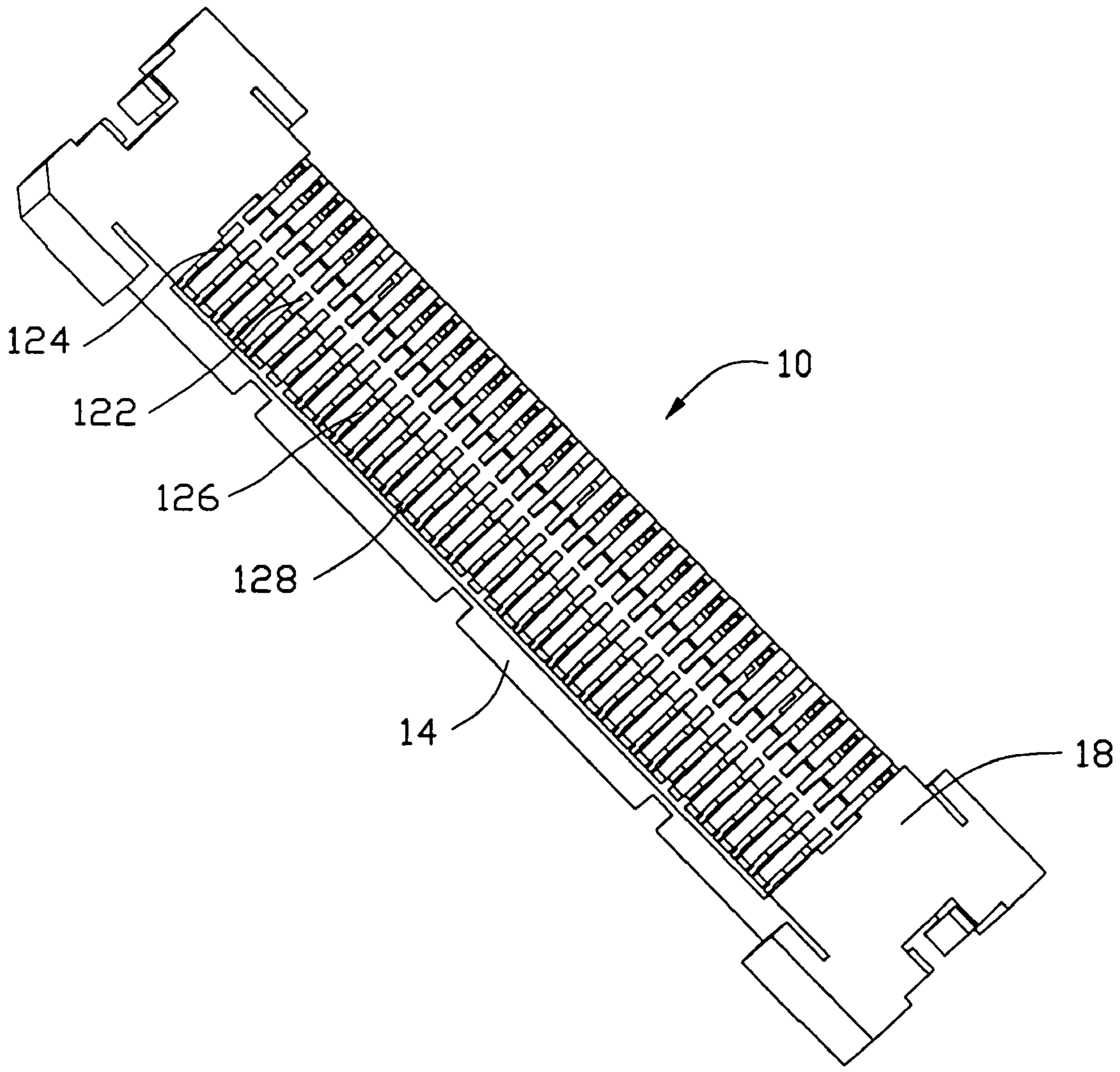
FIG. 3 is a perspective view of a housing of the electrical connector in accordance with the present invention.

Please refer to FIGS. 2 and 3, the housing 10 includes a base 18 and a mating portion extending upwardly from the base 18. The mating portion comprises a pair of parallel long sidewalls 14 extending along a longitudinal direction (arrow A shown in FIG. 1) of the housing 10 traversed by a pair of parallel short end walls 16 extending along a lateral direction of the housing 10 to define an elongated opening therebetween. Each sidewall defines a plurality of first passageways 128 therein. The mating portion includes a tongue 12 located in a center of the opening. The tongue 12 defines a plurality of terminal channels 124 along an upper-to-lower direction at two opposite outsides thereof, respectively. The tongue 12 further defines two rows of second passageways 122 therein. The base 18 defines a plurality of third passageways 126. The first passageway 128, the channel 124 and second passageway 122 communicate with a same third passageway 126. The housing 10 further defines an L-shaped slot 102 in each of four corners thereof, respectively.

Figure 4:
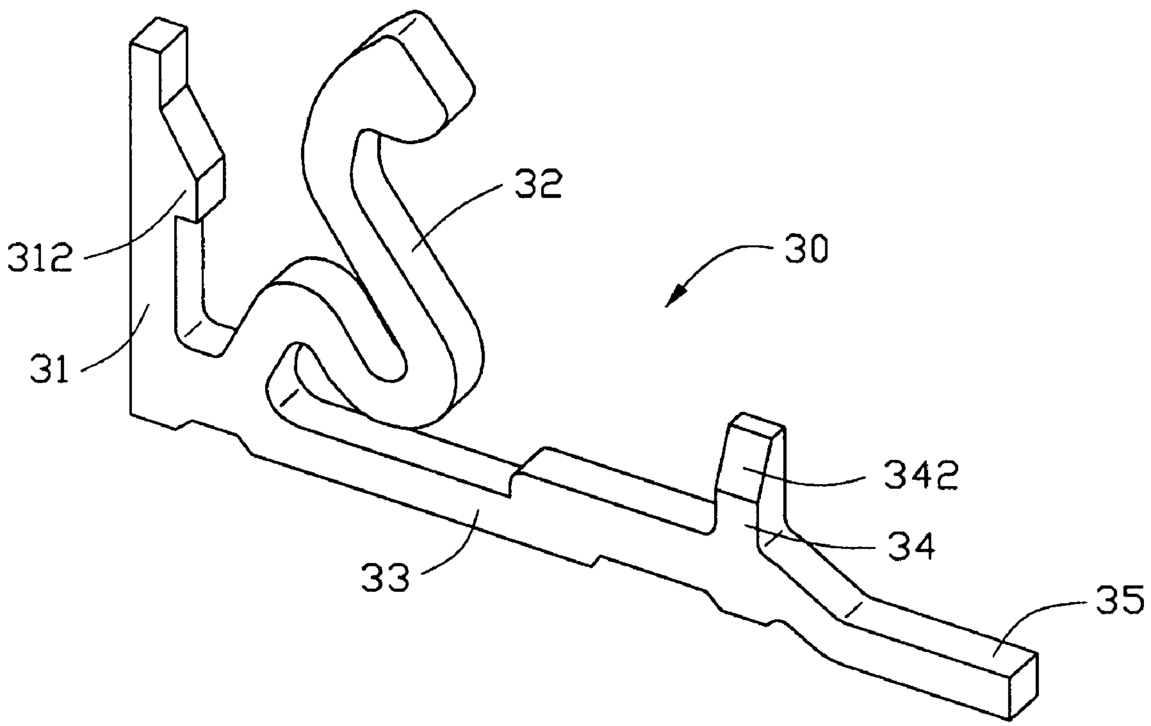
FIG. 4 is a perspective view of a terminal of the electrical connector in accordance with the present invention.

Please refer to FIG. 4, the terminals 30 arranged in two rows are received in the housing 10. Each terminal 30 includes a connecting portion 33, a retention portion 31 extending upwardly from one end of the connecting portion 33, a positioning portion 34 extending upwardly from the other end of the connecting portion 33, a tail 35 extending horizontally from the connecting portion 33, and a contact portion 32 extending upwardly from the connecting portion 33 adjacent to the retention portion 31. A thickness of the positioning potion along the longitudinal direction decrease from its lower portion to its upper portion, and form an inclined surface 342 on the upper portion thereof. The contact portion 32 is S-shaped. The retention portion 31 further comprises a projection 312 projecting therefrom for interferentially engaging with the second passageway 122.

Please refer to FIG. 2, the pair of shields 20 are assembled onto the housing 10. Each of the shields 20 has a flat body 21 and a pair of opposite wings 22 extending laterally from opposite ends of the body 21. The shield 20 also comprises a plurality of spring tabs 23 extending upwardly from the body 21 and a plurality of grounding tabs 24 extending horizontally from the body 21.

Figure 5:
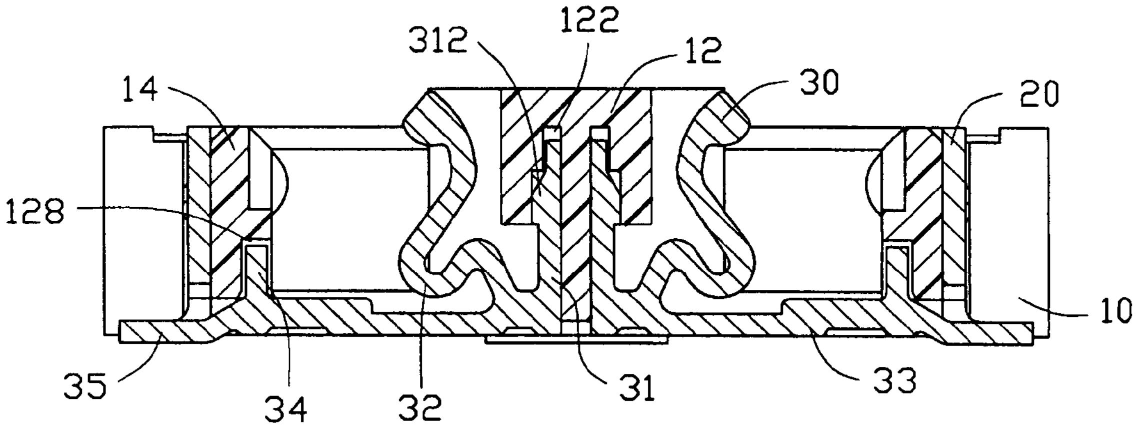
FIG. 5 is a cross-sectional view of the electrical connector taken along line 5—5 of FIG. 1.

Please refer to FIGS. 1, 2, and 5. In assembly, the terminals 30 are inserted into the housing 10 in a lower-to-upper direction. The positioning portions 34 are received in corresponding first passageways 128 and interferentially engaged with the first passageways 128 along the longitudinal direction. The retention portions 31 are received in corresponding second passageways 122. The contact portions 32 are received in corresponding channels 124 with part of the contact portions 32 exposing outside of the channels 124. The connecting portions 33 are received in corresponding third passageways 126. The tails 34 horizontally extend beyond the housing 10. The pair of shields 20 are received in corresponding slots 102 in an upper-to-lower direction.

The terminals having the positioning portion will not move along the longitudinal direction when amounted in the housing. The tail of the terminals of the connector will be soldered to the very traces in the printed circuit board to get good signal transmission therebetween when the connector are mounted to the printed circuit board.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector, comprising:

an elongated insulative housing comprising a pair of sidewalls each defining a plurality of first passageways and a tongue located between the sidewalls, the insulative housing defining a longitudinal direction, the tongue defining a plurality of second passageways and a plurality of terminal channels; and a plurality of terminals received in the insulative housing and arranged along the longitudinal direction, each terminal comprising a connecting portion, a positioning portion extending upwardly from the connecting portion and received in a corresponding first passageway, a retention portion retained in the second passageways of the tongue, and a contact portion extending upwardly from the connecting portion beside the positioning portion and received in the terminal channels of the tongue, the positioning portion interferentially engaging with the sidewall and restricting the terminal from moving along the longitudinal direction.

2. The electrical connector of claim 1, wherein the housing defines a plurality of third passageways therein, and the first passageways, the second passageways and the terminal channels communicate with the third passageways.

3. The electrical connector of claim 2, wherein the connecting portions of the terminals are received in corresponding third passageways, respectively.

4. The electrical connector of claim 3, wherein each terminal comprises a tail extending horizontally from the connecting portion and beyond the insulative housing.

* * * * *